(12) United States Patent
Maeda

(10) Patent No.: US 10,903,443 B2
(45) Date of Patent: Jan. 26, 2021

(54) ORGANIC EL DISPLAY DEVICE

(71) Applicant: Japan Display Inc., Minato-ku (JP)

(72) Inventor: Norihisa Maeda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/294,981

(22) Filed: Mar. 7, 2019

(65) Prior Publication Data
US 2019/0280239 A1  Sep. 12, 2019

(30) Foreign Application Priority Data

Mar. 8, 2018 (JP) ................................. 2018-041768

(51) Int. Cl.
| | | |
|---|---|---|
| H01L 51/50 | (2006.01) | |
| H01L 27/32 | (2006.01) | |
| H01L 51/52 | (2006.01) | |
| H01L 51/00 | (2006.01) | |

(52) U.S. Cl.
CPC ...... *H01L 51/5096* (2013.01); *H01L 27/3246* (2013.01); *H01L 51/006* (2013.01); *H01L 51/5206* (2013.01); *H01L 51/5225* (2013.01)

(58) Field of Classification Search
None
See application file for complete search history.

(56) References Cited

U.S. PATENT DOCUMENTS

| | | | | |
|---|---|---|---|---|
| 2011/0272675 A1* | 11/2011 | Chung | ................ | H01L 27/3246 257/40 |
| 2016/0013255 A1* | 1/2016 | Sato | .................... | H01L 51/5012 257/40 |
| 2016/0155785 A1* | 6/2016 | Sato | .................... | H01L 27/3246 257/40 |
| 2016/0322438 A1* | 11/2016 | Baek | ..................... | H01L 51/525 |
| 2018/0247986 A1 | 8/2018 | Maeda | | |
| 2018/0331315 A1 | 11/2018 | Maeda | | |

FOREIGN PATENT DOCUMENTS

| | | |
|---|---|---|
| JP | 2009-088320 | 4/2009 |
| JP | 2016-103395 | 6/2016 |
| JP | 2018-106803 | 7/2018 |
| JP | 2018-142442 | 9/2018 |
| JP | 2018-194572 | 12/2018 |

* cited by examiner

*Primary Examiner* — Khaja Ahmad
(74) *Attorney, Agent, or Firm* — Oblon, McClelland, Maier & Neustadt, L.L.P.

(57) ABSTRACT

An organic EL display device according to an embodiment of the present invention includes: a substrate; a plurality of pixels located on the substrate; lower electrodes respectively included in the plurality of pixels; a bank defining the plurality of pixels and located between the lower electrodes next to each other; an organic material layer disposed on the lower electrodes and on the bank; and an upper electrode disposed on the organic material layer. A carrier movement preventing layer preventing movement of carriers from the upper electrode to the organic material layer is formed between the organic material layer and the upper electrode on the bank.

10 Claims, 8 Drawing Sheets

ORGANIC EL DISPLAY DEVICE

CROSS-REFERENCE TO RELATED APPLICATION

The present application claims priority from Japanese Application JP 2018-41768 filed on Mar. 8, 2018, the content of which is hereby incorporated by reference into this application.

BACKGROUND OF THE INVENTION

1. Field of the Invention

The present invention relates to an organic EL display device.

2. Description of the Related Art

An organic electroluminescent (EL) display device includes a display panel in which thin film transistors (TFTs), organic light emitting diodes (OLEDs), and the like are formed on a substrate. The OLED includes an organic material layer between a pair of electrodes. The organic material layer is configured by, for example, stacking a hole transport layer, a light emitting layer, an electron transport layer, and the like. The organic material layer is typically formed in a region surrounded by a convex bank previously provided to define pixels. For example, in JP 2009-88320 A, the organic material layer is formed (separately applied) for each of the pixels; however, when a higher definition is achieved or when the aperture ratio of the bank is increased to enhance luminous efficiency, there is a problem in that it is difficult to control separate applying. On the other hand, for example when a conductive material of the hole transport layer or the like is provided common to a plurality of pixels, there is a problem in that a leakage current flows between the pixels next to each other. Specifically, there is a problem in that the next pixel that should not originally emit light emits light due to the leakage current, and thus that color purity is reduced or image quality is deteriorated. The problem may remarkably occur as the definition becomes higher or a drive voltage becomes lower (e.g., a high-mobility material is employed).

To deal with the above described problem, for example JP 2016-103395 A proposes to form a divided region in the organic material layer on the bank to prevent the movement of carriers between the pixels next to each other.

SUMMARY OF THE INVENTION

It is considered that the leakage current not only causes the next pixel to emit light but also causes, for example, light emission on the bank.

In view of the above, it is an object of one or more embodiments of the invention to provide an organic EL display device in which a trouble caused by a leakage current is suppressed.

BRIEF DESCRIPTION OF THE DRAWINGS

An organic EL display device according to an embodiment of the present invention includes: a substrate; a plurality of pixels located on the substrate; lower electrodes respectively included in the plurality of pixels; a bank defining the plurality of pixels and located between the lower electrodes next to each other; an organic material layer disposed on the lower electrodes and on the bank; and an upper electrode disposed on the organic material layer. A carrier movement preventing layer preventing movement of carriers from the upper electrode to the organic material layer is formed between the organic material layer and the upper electrode on the bank.

DETAILED DESCRIPTION OF THE INVENTION

Figure 1:
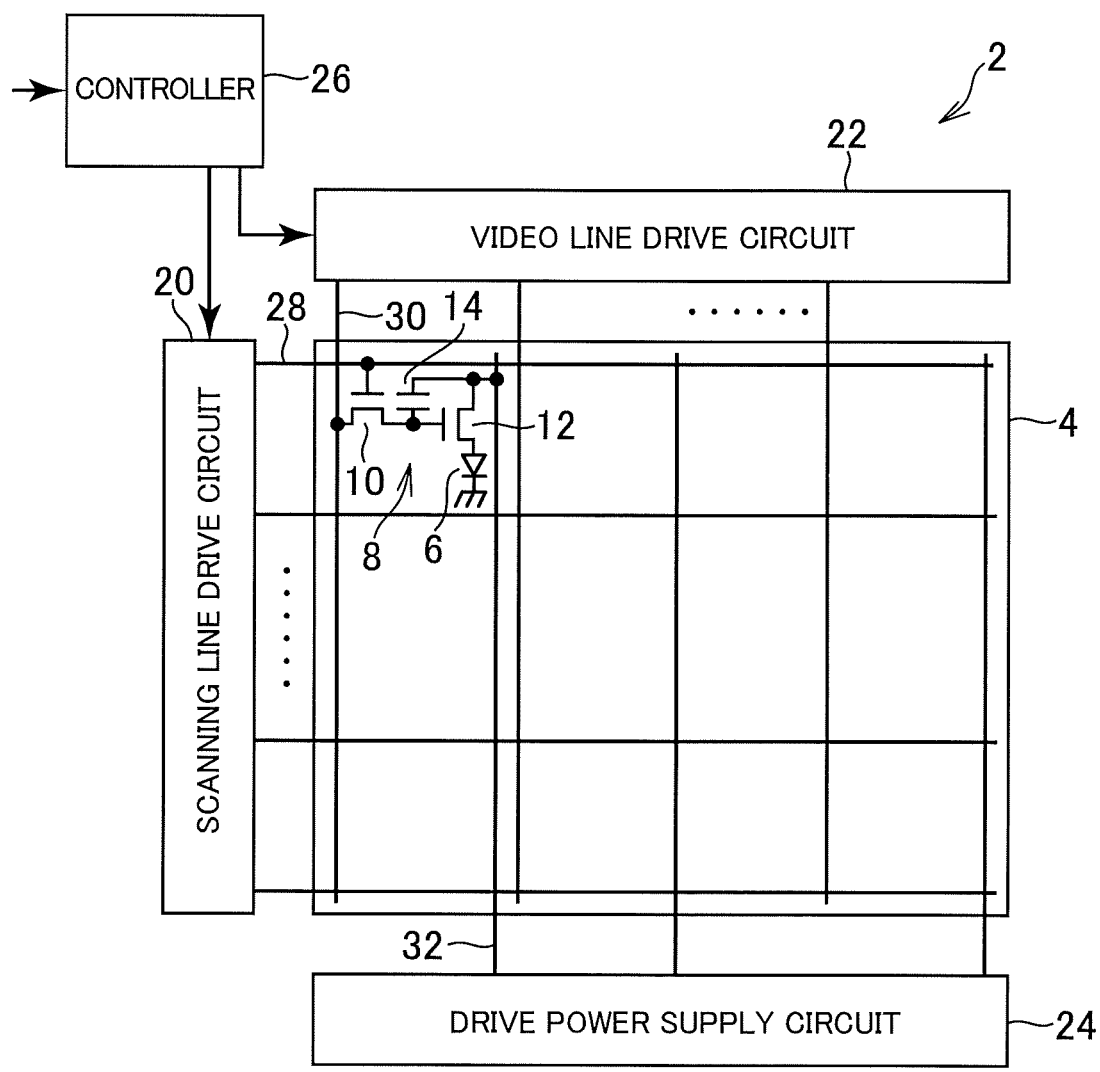
FIG. 1 is a schematic view showing a schematic configuration of an organic EL display device according to an embodiment of the invention.

Hereinafter, embodiments of the invention will be described with reference to the drawings. The disclosure is merely an example. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in practicing aspects of the invention. However, they are merely examples and do not limit the interpretation of the invention. Moreover, in the specification and the drawings, elements similar to those described in relation to a previous drawing are denoted by the same reference numerals and signs, and a detailed description may be appropriately omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

FIG. 1 is a schematic view showing a schematic configuration of an organic EL display device according to an embodiment of the invention. An organic EL display device 2 includes a pixel array section 4 that displays an image, and a drive section that drives the pixel array section 4. The organic EL display device 2 includes a display panel configured by stacking structures such as TFTs and OLEDs on a substrate. The schematic view shown in FIG. 1 is an example, and the embodiment is not limited to this configuration.

In the pixel array section 4, OLEDs 6 and pixel circuits 8 are disposed in a matrix corresponding to pixels. The pixel circuit 8 is configured of a plurality of TFTs 10 and 12 and a capacitor 14.

The drive section includes a scanning line drive circuit 20, a video line drive circuit 22, a drive power supply circuit 24, and a controller 26. The drive section drives the pixel circuit 8 to control light emission of the OLED 6.

The scanning line drive circuit 20 is connected to scanning signal lines 28 each provided for an array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to video signal lines 30 each provided for an array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal of the selected pixel row to each of the video signal lines 30. The voltage is written to the capacitor 14 via the lighting TFT 10 in the selected pixel row. The drive TFT 12 supplies a current in response to the written voltage to the OLED 6, and thus the OLED 6 of the pixel corresponding to the selected scanning signal line 28 emits light.

The drive power supply circuit 24 is connected to drive power supply lines 32 each provided for the pixel column, and supplies a current to the OLED 6 via the drive power supply line 32 and the drive TFT 12 in the selected pixel row.

Here, a lower electrode of the OLED 6 is connected to the drive TFT 12. On the other hand, upper electrodes of the OLEDs 6 are configured of an electrode common to the OLEDs 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
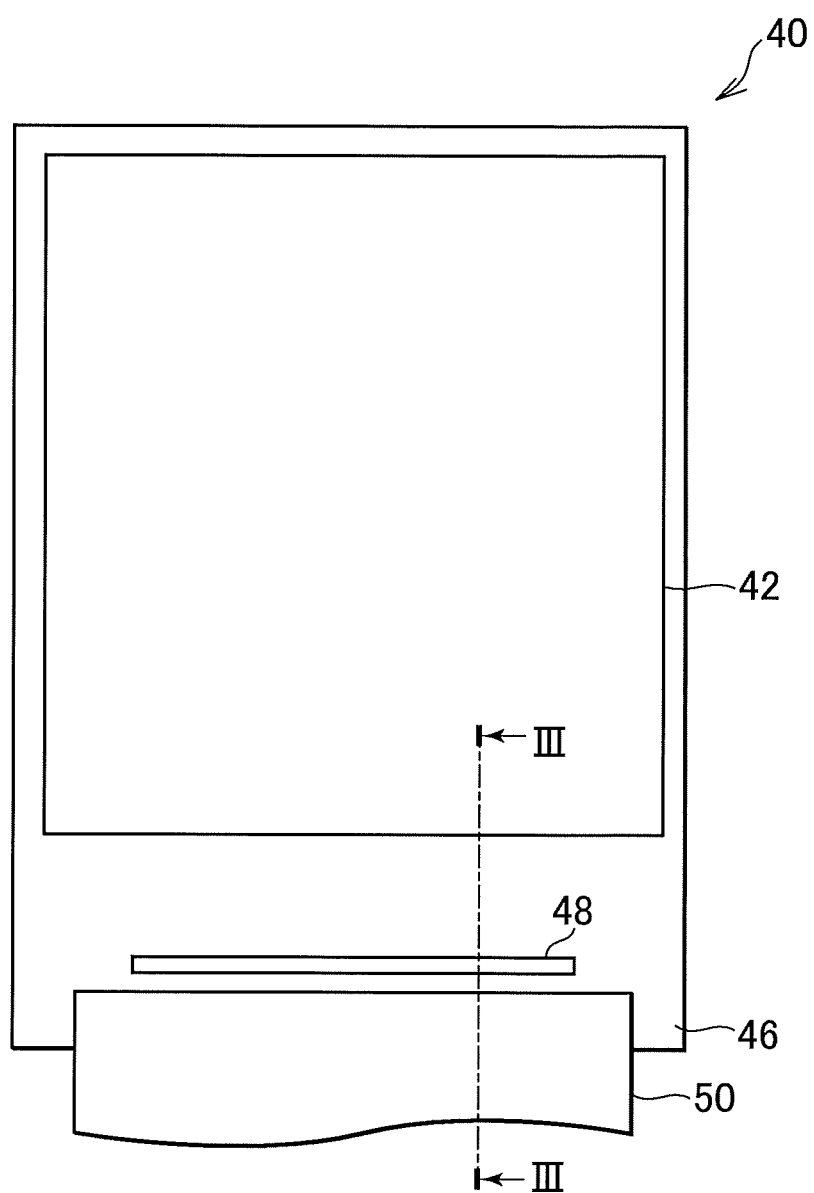
FIG. 2 is a schematic plan view showing an example of a display panel of the organic EL display device shown in FIG. 1.

FIG. 2 is a schematic plan view showing an example of the display panel of the organic EL display device shown in FIG. 1. In a display region 42 of a display panel 40, the pixel array section 4 shown in FIG. 1 is provided, and the OLEDs 6 are arranged in the pixel array section 4 as described above. The upper electrode constituting the OLED 6 is formed common to the pixels as described above, and covers the entire display region 42.

On one side of the display panel 40 having a rectangular shape, a component mounting region 46 is provided. Wiring lines connected to the display region 42 are disposed on the component mounting region 46. A driver integrated circuit (IC) 48 constituting the drive section is mounted in the component mounting region 46, and a flexible printed circuit (FPC) 50 is connected thereto. The FPC 50 is connected to the controller 26, the circuits 20, 22, and 24, and the like, and an IC is mounted on the FPC 50.

Figure 3:
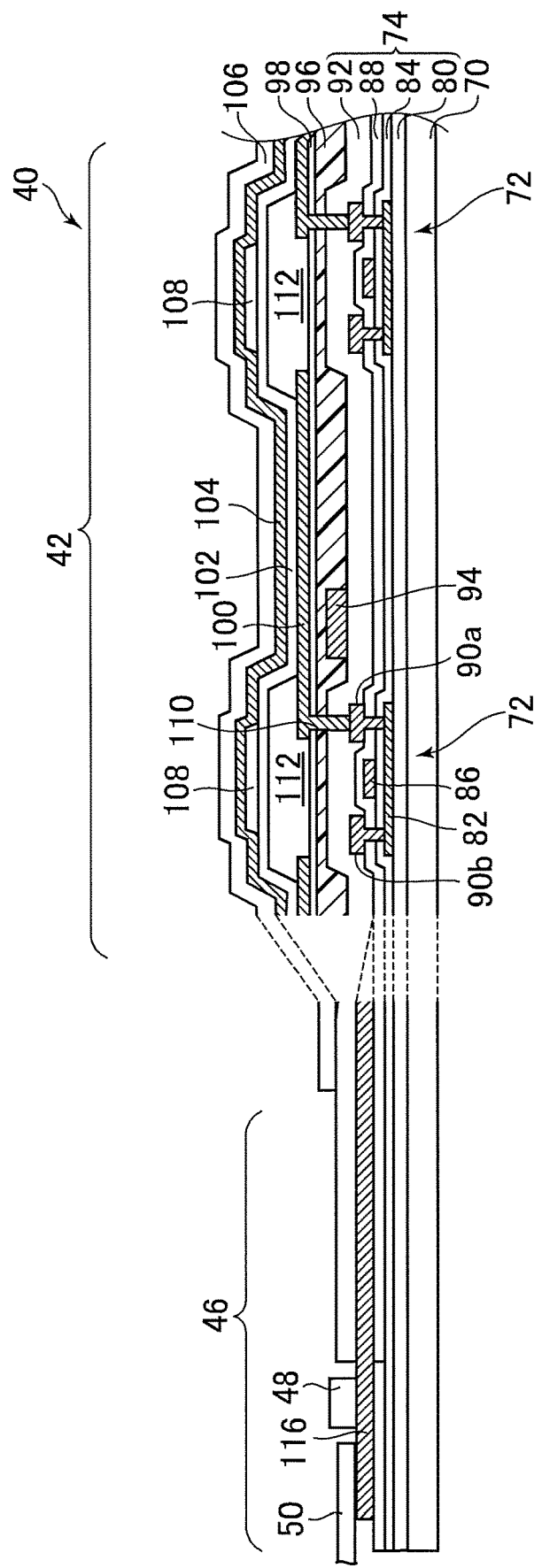
FIG. 3 is a diagram showing an example of a cross section taken along line in FIG. 2.

FIG. 3 is a diagram showing an example of a cross section taken along line in FIG. 2. The display panel 40 has a structure in which a circuit layer 74 including TFTs 72, the OLEDs 6, a sealing layer 106 sealing the OLEDs 6, and the like are stacked on a substrate 70. The substrate 70 is configured of, for example, a glass plate or a resin film (e.g., a resin film containing resin such as polyimide-based resin). In the embodiment, the pixel array section 4 is of a top-emission type, and light generated by the OLED 6 is emitted to the side (upward in FIG. 3) opposite to the substrate 70 side.

In the circuit layer 74 of the display region 42, the pixel circuit 8, the scanning signal line 28, the video signal line 30, the drive power supply line 32, and the like, which are described above, are formed. At least a portion of the drive section can be formed as the circuit layer 74 in a region next to the display region 42 on the substrate 70. As described above, the driver IC 48 which constitutes the drive section and the FPC 50 can be connected to a wiring line 116 of the circuit layer 74 in the component mounting region 46.

As shown in FIG. 3, an under layer 80 formed of an inorganic insulating material is disposed on the substrate 70. As the inorganic insulating material, for example silicon nitride ($SiN_y$), silicon oxide ($SiO_x$), or a complex of these materials is used.

In the display region 42, a semiconductor region 82 serving as a channel portion and a source-drain portion of the TFT 72 of a top-gate type is formed on the substrate 70 via the under layer 80. The semiconductor region 82 is formed of, for example, polysilicon (p-Si). The semiconductor region 82 is formed by, for example, providing a semiconductor layer (p-Si film) on the substrate 70, and patterning the semiconductor layer to selectively leave portions to be used for the circuit layer 74.

Above the channel portion of the TFT 72, a gate electrode 86 is disposed via a gate insulating film 84. The gate insulating film 84 is typically formed of TEOS. The gate electrode 86 is formed by, for example, patterning a metal film formed by sputtering or the like. An interlayer insulating layer 88 is disposed so as to cover the gate electrode 86 on the gate electrode 86. The interlayer insulating layer 88 is formed of, for example, the inorganic insulating material described above. An impurity is introduced by ion implantation into the semiconductor region 82 (p-Si) serving as the source-drain portion of the TFT 72, and further, a source electrode 90a and a drain electrode 90b that are electrically connected to the semiconductor region 82 are formed, so that the TFT 72 is configured.

An interlayer insulating film 92 is disposed on the TFT 72. A wiring line 94 is disposed on the surface of the interlayer insulating film 92. The wiring line 94 is formed by, for example, patterning a metal film formed by sputtering or the like. Using the metal film forming the wiring line 94 and the metal film used for the formation of the gate electrode 86, the source electrode 90a, and the drain electrode 90b, for example, the scanning signal line 28, the video signal line 30, and the drive power supply line 32, which are shown in FIG. 1, and the wiring line 116 can be formed to have a multilayer wiring structure. A planarization film 96 and a passivation film 98 are formed on this structure, and the OLED 6 is formed on the passivation film 98 in the display region 42. The planarization film is formed of, for example, a resin material. The passivation film 98 is formed of, for example, an inorganic insulating material such as $SiN_y$.

The OLED 6 includes a lower electrode 100, an organic material layer 102, and an upper electrode 104. The OLED 6 is typically formed by stacking the lower electrode 100, the organic material layer 102, and the upper electrode 104 in this order from the substrate 70 side. In the embodiment, the lower electrode 100 is an anode of the OLED 6, and the upper electrode 104 is a cathode thereof.

When it is assumed that the TFT 72 shown in FIG. 3 is a drive TFT 12 having an n-channel, the lower electrode 100 is connected to the source electrode 90a of the TFT 72. Specifically, after the formation of the planarization film 96 described above, a contact hole 110 for connecting the lower electrode 100 to the TFT 72 is formed, and by, for example, patterning a conductor portion formed on the surface of the planarization film 96 and within the contact hole 110, the lower electrode 100 connected to the TFT 72 is formed for each pixel. The lower electrode 100 is formed of, for example, transparent metal oxide such as indium tin oxide (ITO) and indium zinc oxide (IZO), or metal such as Ag and Al.

A bank 112 separating pixels is disposed on the structure described above. The bank 112 is used to electrically separate the lower electrodes 100 provided corresponding to the respective pixels, and is formed so as to cover the peripheral edge of the lower electrode 100 from the upper surface to the side surface. Specifically, the bank 112 includes an opening exposing a portion of the lower electrode 100. The bank 112 is typically formed of a resin material such as polyimide-based resin and acrylic-based resin. The side surface of the bank 112 includes an inclined surface that is inclined toward the substrate 70 side as it is extended toward the lower electrode 100 side (outside).

For example, after the formation of the lower electrode 100, the bank 112 is formed at a pixel boundary, and the organic material layer 102 and the upper electrode 104 are stacked in an effective region (a region where the lower electrode 100 is exposed) of a pixel surrounded by the bank 112. The organic material layer 102 (in some cases, light emitting layers 102b to be described later may be excluded) and the upper electrode 104 are provided common to pixels, and are provided not only on the upper surface of the lower electrode 100 but also on the bank 112.

The organic material layer 102 typically includes a plurality of layers. Specifically, the organic material layer 102 is formed by stacking a hole transport layer, a light emitting layer, and an electron transport layer in order from the anode side. Moreover, the organic material layer 102 may include another layer. Examples of another layer include, for example, a hole injection layer or electron blocking layer disposed between the anode and the light emitting layer and an electron injection layer or hole blocking layer disposed between the cathode and the light emitting layer. The upper electrode 104 is configured of a transmissive conductive film. The transmissive conductive film is formed of, for example, an extremely thin alloy of Mg and Ag, or a transparent metal oxide such as ITO and IZO.

A sealing layer 106 is disposed on the upper electrode 104. The sealing layer 106 may function, for example, as a protective layer to protect the OLED 6 from moisture and the like, and therefore is formed so as to cover the entire display region 42. The sealing layer 106 is formed by, for example, depositing an inorganic insulating material film of $SiN_y$ or the like by a chemical vapor deposition (CVD) method. Although not shown in the drawing, for example a protective film is disposed on the surface of the display region 42 for ensuring the mechanical strength of the surface of the display panel 40. Specifically, a sheet-like or film-like protective film is bonded on the sealing layer 106 via an adhesion layer. In this case, the protective film is not generally provided in the component mounting region 46 for facilitating the connection of the IC or the FPC. A wiring line of the FPC 50 and a terminal of the driver IC 48 are electrically connected to, for example, the wiring line 116.

A carrier movement preventing layer 108 is formed between the organic material layer 102 and the upper electrode 104 on the bank 112. The carrier movement preventing layer 108 is in direct contact with the organic material layer 102 and the upper electrode 104. Disposing the carrier movement preventing layer 108 between the organic material layer 102 and the upper electrode 104 suppresses the injection of carriers from the upper electrode 104 into the organic material layer 102 on the bank 112, which may prevent light emission on the bank 112 and thus contribute to an improvement in luminous efficiency and an improvement in display characteristics (e.g., front chromaticity and visual characteristics).

Figure 4:
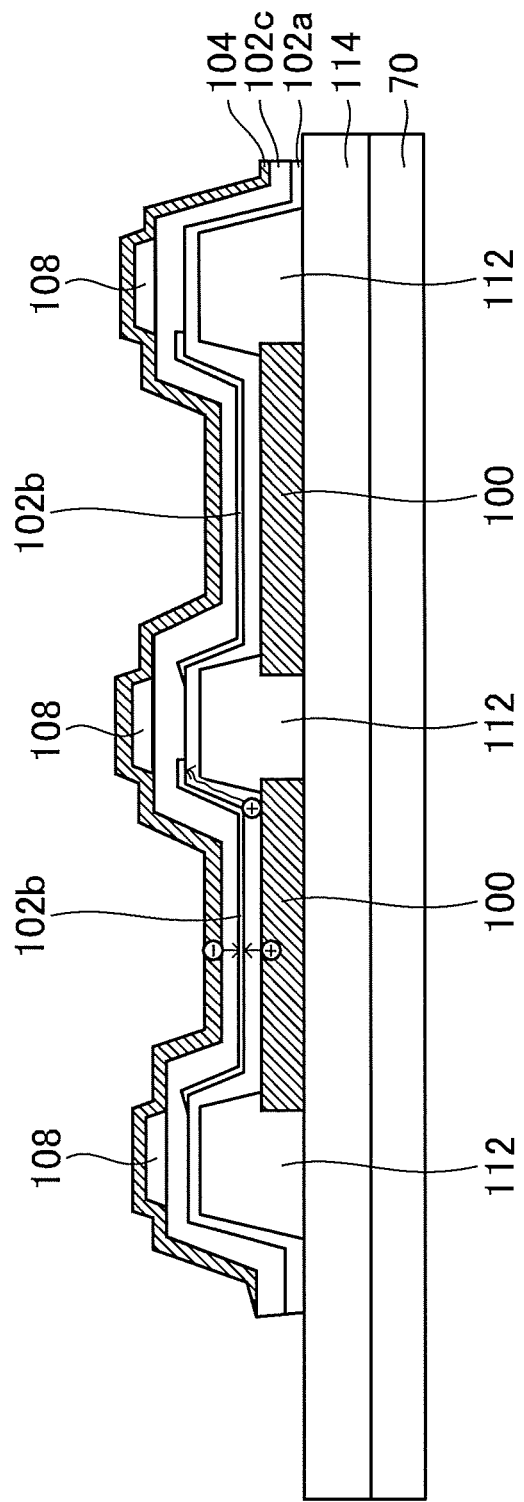
FIG. 4 is an enlarged cross-sectional view of an example of the vicinity of a bank of the display panel shown in FIG. 3.

FIG. 4 is an enlarged cross-sectional view of an example of the vicinity of the bank of the display panel shown in FIG. 3, in which, in the stacked structure of the display panel 40 shown in FIG. 3, a stacked structure from the under layer 80 to the passivation film 98 on the substrate 70 is shown in a simplified manner as an upper structure layer 114, and the sealing layer 106 is omitted. The organic material layer 102 is formed, for example, as follows: a hole transport layer 102a is continuously formed (provided common to a plurality of pixels) on the lower electrode (anode) 100 and the bank 112; the light emitting layers 102b corresponding to the colors of the respective pixels are formed in respective pixel regions on the hole transport layer 102a; and an electron transport layer 102c is formed so as to cover the light emitting layers 102b (common to the plurality of pixels). The light emission on the bank 112 may occur when the light emitting layer 102b is present on the bank 112 as shown in FIG. 4. Specifically, when holes are injected from the anode 100 into the organic material layer 102 while electrons are injected from the cathode 104 into the organic material layer 102, the holes and the electrons are recombined together in the light emitting layer 102b and thus the light emitting layer 102b emits light. However, when the light emitting layer 102b is present on the bank 112, light emission may also occur on the bank 112. The light emission on the bank 112 is relatively weak (e.g., light emission to such an extent that can be confirmed by microscopic observation or at a level that is not confirmed by microscopic observation but can be confirmed by microspectroscopy) but may affect luminous efficiency or display characteristics. As described above, disposing the carrier movement preventing layer 108 between the organic material layer 102 and the upper electrode 104 on the bank 112 suppresses the injection of carriers (electrons) from the upper electrode (cathode) 104 into the organic material layer 102, which may prevent light emission on the bank 112.

The carrier movement preventing layer 108 is formed of any appropriate material that may prevent the movement of carriers from the upper electrode 104 to the organic material layer 102. In one embodiment, the configuration of the carrier movement preventing layer 108 is determined depending on the upper electrode 104. For example, when the upper electrode 104 is a cathode as described above, the carrier movement preventing layer 108 is formed of a material that may prevent the movement of electrons from the upper electrode 104 to the organic material layer 102. For example, the carrier movement preventing layer 108 is formed of a material that forms a layer having an electron mobility lower than that of an electron injection layer or electron transport layer that may be included in the organic material layer 102. Specific examples of the layer include a hole transport layer that may constitute the organic material layer 102. In this case, the carrier movement preventing layer 108 can be formed of a material that forms the organic material layer 102, which may be excellent in manufacturing efficiency. Examples of the material forming the hole transport layer include 4,4'-bis[N-(naphthyl)-N-phenyl-amino] biphenyl (α-NPD), N,N'-bis(3-methylphenyl)-(1,1'-biphenyl)-4,4'-diamine (TPD), 2-TNATA, and 4,4',4''-tris(N-(3- methylphenyl)N-phenylamino)triphenylamine (MTDATA). In another embodiment, the carrier movement preventing layer 108 is formed of an insulating material. That is, the carrier movement preventing layer 108 may be an insulating layer. As the insulating material, for example, an inorganic insulating material represented by silicon nitride ($SiN_y$), silicon oxide ($SiO_x$), and a complex of these materials, resin, or the like is used.

The carrier movement preventing layer 108 may be formed by any appropriate method. Examples of the forming method include, for example, deposition by mask evaporation using a mask having a pattern, and deposition by a laser transfer method. The thickness of the carrier movement preventing layer 108 is, for example, from 5 nm to 50 nm.

Figure 5A:
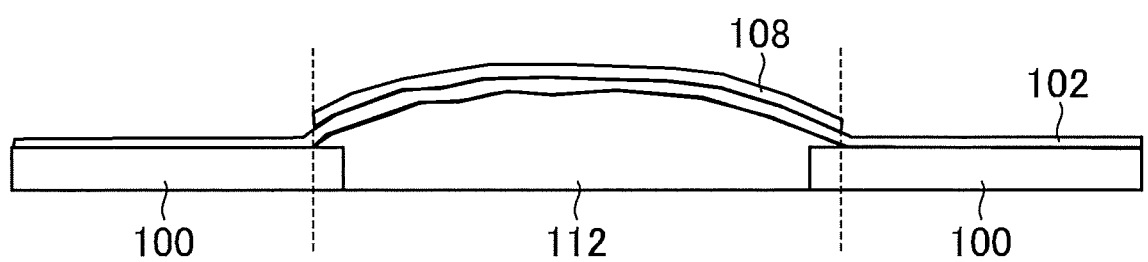
FIG. 5A is a diagram for explaining the positional relationship between the bank and a carrier movement preventing layer.
Figure 5B:
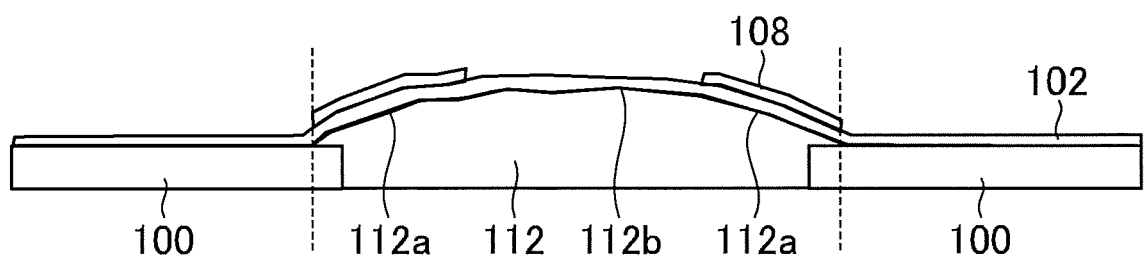
FIG. 5B is a diagram for explaining the positional relationship between the bank and the carrier movement preventing layer.
Figure 5C:
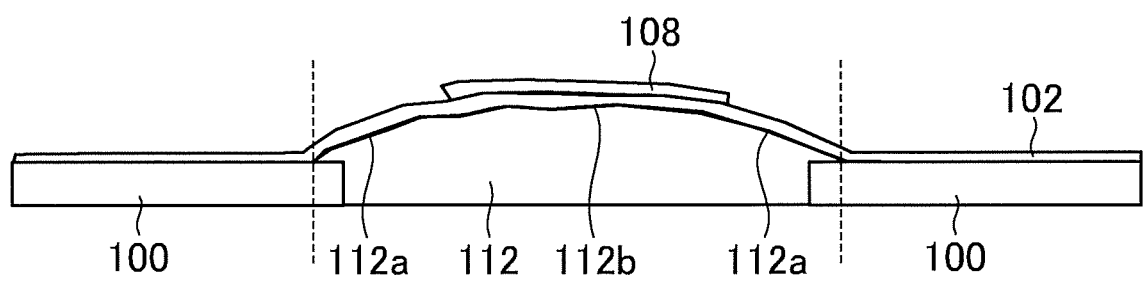
FIG. 5C is a diagram for explaining the positional relationship between the bank and the carrier movement preventing layer.
Figure 5D:
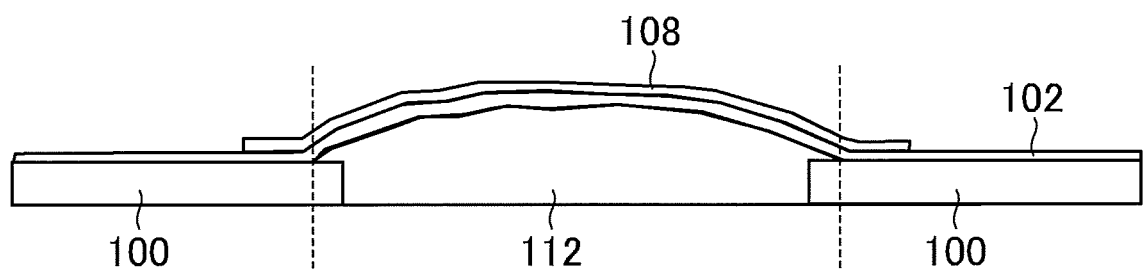
FIG. 5D is a diagram for explaining the positional relationship between the bank and the carrier movement preventing layer.

FIGS. 5A to 5D are diagrams for explaining the positional relationship between the bank and the carrier movement preventing layer. In a preferred embodiment, as shown in FIG. 5A, the carrier movement preventing layer 108 is formed such that the carrier movement preventing layer 108 covers the entire bank 112 and does not overlap the opening of the bank 112 with an edge portion of the carrier movement preventing layer 108 aligned with an edge portion of the bank 112. In another embodiment, as shown in FIG. 5B, the carrier movement preventing layer 108 is formed so as to cover at least an edge portion (inclined surface) 112a of the bank 112, and is opposed to the edge portion of the bank 112. In addition, the carrier movement preventing layer 108 is not formed at a central portion 112b of the bank 112. It can be said that the central portion 112b of the bank 112 is a central portion of the upper surface of the bank 112 located between the lower electrodes 100 next to each other. Light emission on the bank 112 is stronger as the place is closer to the opening of the bank 112, and in this embodiment, the carrier movement preventing layer 108 is selectively formed at a place where light emission is strong. In still another embodiment, as shown in FIG. 5C, the carrier movement preventing layer 108 is formed at at least the central portion 112b of the bank 112 so as to cover the central portion 112b, and is not formed at the edge portion (inclined surface) 112a of the bank 112. This embodiment is preferable in terms of, for example, low difficulty of formation of the carrier movement preventing layer 108. In still further another embodiment, as shown in FIG. 5D, the carrier movement preventing layer 108 is formed such that the carrier movement preventing layer 108 covers the entire bank 112, and that an edge portion of the carrier movement preventing layer 108 also covers the opening of the bank 112. In this embodiment, an opening region (light emitting region) of the bank 112 is small; however, light emission on the bank 112 may be effectively prevented.

The invention is not limited to the embodiments, and various modifications can be made. For example, the configuration described in each of the embodiments may be replaced with substantially the same configuration, a configuration providing the same operational effect, or a configuration capable of achieving the same object.

Various altered and modified examples within the idea of the invention will occur to those skilled in the art, and it is understood that the altered and modified examples also belong to the scope of the invention. For example, when those skilled in the art appropriately add or remove a component or change the design of a component in the embodiments described above, or add or omit a step or change the conditions of a step in the embodiments described above, the modification is also included in the scope of the invention as long as they include the spirit of the invention.

What is claimed is:

1. An organic EL display device comprising:
   a substrate;
   a plurality of pixels located on the substrate;
   lower electrodes respectively included in the plurality of pixels;
   a bank defining the plurality of pixels and located between the lower electrodes next to each other;
   an organic material layer disposed on the lower electrodes and on the bank; and
   an upper electrode disposed on the organic material layer, wherein
   a carrier movement preventing layer preventing movement of carriers from the upper electrode to the organic material layer is formed between the organic material layer and the upper electrode directly above the bank,
   wherein the upper electrode is a cathode, and the carrier movement preventing layer contains a material contained in a hole transport layer constituting the organic material layer.

2. The organic EL display device according to claim 1, wherein
   the carrier movement preventing layer is in direct contact with the organic material layer and the upper electrode.

3. The organic EL display device according to claim 1, wherein
   the organic material layer includes a plurality of layers, and at least a portion of the layers of the organic material layer extends over the plurality of pixels.

4. The organic EL display device according to claim 1, wherein
   the upper electrode is a cathode, and the carrier movement preventing layer is a layer having an electron mobility lower than that of an electron injection layer or electron transport layer constituting the organic material layer.

5. The organic EL display device according to claim 1, wherein
   the upper electrode is a cathode, and the carrier movement preventing layer contains one or more kinds selected from the group consisting of 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, and 4,4',4''-tris(N-(3-methylphenyl)N-phenylamino)triphenylamine (MTDATA).

6. The organic EL display device according to claim 1, wherein
   the carrier movement preventing layer contains an insulating material.

7. The organic EL display device according to claim 1, wherein
   an edge portion of the bank and an edge portion of the carrier movement preventing layer overlap in a plan view.

8. The organic EL display device according to claim 1, wherein
   the carrier movement preventing layer is opposed to at least an edge portion of the bank.

9. The organic EL display device according to claim 1, wherein
   the bank includes an upper surface located between the lower electrodes next to each other, and
   the carrier movement preventing layer is opposed to at least a central portion of the upper surface.

10. The organic EL display device according to claim 1, wherein
    the bank includes an opening exposing a portion of the lower electrode, the carrier movement preventing layer covers the bank, and an edge portion of the carrier movement preventing layer is opposed to a portion of the opening.

\* \* \* \* \*